United States Patent Office 3,479,185

Patented Nov. 18, 1969

3,479,185

PHOTOPOLYMERIZABLE COMPOSITIONS AND LAYERS CONTAINING 2,4,5-TRIPHENYLIMIDAZOYL DIMERS

Vaughan Crandall Chambers, Jr., Wilmington, Del., assignor to E. I. du Pont de Nemours and Company, Wilmington, Del., a corporation of Delaware No Drawing. Continuation-in-part of application Ser. No. 531,784, Mar. 4, 1966. This application Dec. 7, 1967, Ser. No. 688,703

Int. Cl. G03c *1/70;* C08f *29/10*

U.S. Cl. 96—84 15 Claims

ABSTRACT OF THE DISCLOSURE

Photopolymerizable compositions or layers containing an ethylenically unsaturated compound, at least one free-radical producing electron donor agent, and a 2,4,5-triphenylimidazolyl dimer consisting of two iophine radicals bound together by a single covalent bond, and process comprising imagewise photopolymerization of said layers.

This application is a continuation-in-part of my copending application Ser. No. 531,784 filed Mar. 4, 1966 and entitled "Photopolymerizable Products and Processes" (now abandoned).

BACKGROUND OF THE INVENTION

Field of the invention

The invention pertains to photopolymerizable elements, compositions, and processes of photopolymerization which contain novel initiators for free radical addition polymerization. More particularly, it pertains to such elements, compositions and processes that have polymerization initiators capable of increasing the speed of polymerization and improving the spectral response of said elements and compositions.

Description of the prior art

Photopolymerizable compositions and elements as image-forming systems are well known in the art. Such elements may be used for preparing relief printing plates as described in detail in Plambeck U.S. Patents 2,760,863; 2,791,504; and 2,964,401, or for producing copies of images as described in U.S. Patents Burg et al., 3,060,023; 3,060,024; and 3,060,025; Heiart 3,060,026 and Assignee's Colgrove application S.N. 403,938 filed Oct. 14, 1964 (U.S. Patent 3,353,955, Nov. 21, 1967). In the uses described in the above patents, the photopolymerizable elements are generally exposed imagewise to actinic radiation while in contact with an original, a process transparency, or a stencil until substantial addition polymerization takes place in the exposed areas to form an addition polymer and without substantial polymerization in the underexposed, complementary, adjoining image areas. The exposure is usually accomplished by contact transmission or reflectographic techniques. After exposure, the elements are developed by suitable means, e.g., solvent washout, thermal transfer, pressure transfer, dusting of pigments, differential adhesion of exposed vs. underexposed areas, etc. to produce, e.g., an image on a receptor or a relief suitable for printing.

In the photopolymerization of the ethylenically unsaturated compounds disclosed in the above patents, many initiators for increasing the speed of such polymerization are known. Some of these initiators are the vicinal polyketaldonyl compounds of U.S. 2,367,660, e.g., diacetyl, benzil, etc., the α-carbonyl alcohols of U.S. 2,367,661 and U.S. 2,367,670, such as benzoin, pivaloin, etc.; acyloin ethers of U.S. 2,448,828, such as benzoin methyl or ethyl ethers, etc., the α-hydrocarbon-substituted aromatic acyloins, of U.S. 2,722,512, e.g., α-methyl-, α-allyl-, α-phenyl-benzoin, etc.; and the polynuclear quinones of Barney et al., 3,046,127 and Notley 2,951,758. The use of these initiators has usually limited the use of the photopolymerizable compositions to exposure to the shorter, higher energy wave lengths, i.e., ultraviolet and blue light of wave length shorter than 450 mμ and due to the low photographic speed, contact reflex or contact transmission exposures.

With the advent of dye sensitized photopolymerization, visible light could be used to initiate polymerization. Oster U.S. Patents 2,850,445; 2,875,047; and 3,097,096 disclose the use of various photo-reducible dyes in combination with mild reducing agents to initiate the polymerization of liquid, photopolymerizable, organic vinyl monomers. However, with the increased uses envisioned for photopolymerizable elements and processes, it becomes desirable to obtain elements having improved spectral response and faster photographic speeds to permit projection and camera type exposures. It is also desirable to have these elements in a dry system rather than liquid.

SUMMARY OF THE INVENTION

The photopolymerizable compositions, layers and elements of the invention comprise (1) at least one ethylenically unsaturated monomer, (2) at least one electron donor agent, and (3) a 2,4,5-triphenylimidazolyl dimer consisting of two lophine radicals bound together by a single covalent bond.

DESCRIPTION OF THE PREFERRED EMBODIMENTS

This invention, in one important aspect, comprises a photopolymerizable layer containing (1) at least one non-gaseous ethylenically unsaturated compound capable of forming a high polymer by free-radical initiated, chain-propagating, addition polymerization.

(2) a free radical producing, electron donor agent, and (3) a 2,4,5-triphenylimidazolyl dimer consisting of two lophine radicals bound together by a single convalent bond.

Agent (2) has a reatcive atom, usually hydrogen, which is removable and in the presence of the lophyl radical of constituent (3) yields a radical which reacts with monomer (1) to initiate growth of polymer chains.

Preferred free radical producing agents are organic amines. These include compounds of the type $R_3N$ where an R may be H but at least one R is an organic radical connected to the N through a $—CH_2R'$, $—CHR'_2$ or $—CR'_3$ group where R′ is hydrogen, hydrocarbon or substituted hydrocarbon. Especially useful are tertiary amines where each R is connected to N through a carbon atom which, in turn, is attached only to carbon or hydrogen. The most useful amines are aromatic amines where one of the R groups is phenyl, tolyl, naphthyl, etc. Members of this class, characterized by the presence of the group aryl-N=(alkyl)$_2$, are known as tertiary aromatic amines. One secondary amine which has been found to have unusual properties is N-phenylglycine which, when used alone or in conjunction with a tertiary aromatic amine, provides an unexpectedly useful initiating free radical.

Another useful class of radical producing agents (2) is the group known as mercaptans having the structure RSH where R is an alkyl, arylalkyl or aryl group. They are useful alone but are particularly useful in combination with amine free radical producing agents.

Other useful radical producing agents are $CBr_4$, related compounds having a $—CBr_3$ group, e.g., $C_6H_5CBr_3$ and active methylene compounds, e.g., 5,5-dimethyl-1,3-cyclohexanedione.

Dimer (3) can be represented in one form by the formula given below, the covalent bond being attached in the 1,1'-, 1,2'-, 1,4'-, 2,2'-, 2,4'- or 4,4'-positions, the 1,2-compounds being preferred. The positions of the double bonds in imidazole rings can be determined by the position of the linkage between the rings.

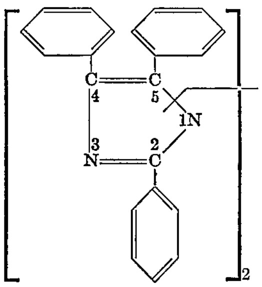

where the phenyl groups may be substituted.

Upon irradiation of the dimer with actinic radiation, the dimer is dissociated into free radicals, the free radicals being reactive with said free radical-producing agent to produce initiating radicals for addition polymerization.

While lophine dimers seem to induce polymerization in the composition without the presence of a separate electron donor or free radical-producing agent, it is believed that this is due to impurities present in the photopolymerizable composition which even in trace amounts function as co-initiators, as the pure dimers do not induce significant polymerization.

In another aspect of the invention, the photopolymerizable layer contains a 2,4,5-triphenylimidazole dimer, a free radical producing agent, and an energy-transfer dye. The energy-transfer dye, e.g., Erythrosin (C.I. Acid Red 51), Rose Bengal (C.I. Acid Red 94), Eosin Y (C.I. Acid Red 87), Phloxin B (C.I. Acid Red 92) etc. extends the sensitivity of the three-component system into the visible spectral region and also increases the speed of polymerization. This four-component system can initiate polymerization with exposure to visible light only. This four-component system has stability and does not lose sensitivity on aging.

In the four-component system, the absorption of energy by the dye induces the same reaction from the lophine dimer combination as direct irradiation of the lophine dimer in the three-component system.

In a still further aspect of the invention, the photopolymerizable stratum or layer contains the 2,4,5-triphenylimidazole dimer, a free radical-producing agent, and a fourth component which serves as an oxygen scavenger, e.g., 2-allyl thiourea, dimethylsulfoxide, stannous chloride or N-phenylglycine.

The oxygen scavenger appears to eliminate or reduce the induction period usually found in a photopolymerization reaction, possibly by consumption of oxygen in the layer prior to exposure. The mechanism of reaction is believed to be the same as that of the three-component system with the fourth component performing its specific function of partial or complete dark consumption of soluble oxygen. The use of this fourth component results in a large increase, i.e., twenty-five fold, in speed.

A five-component system comprising a monomer (1), free radical producing agent (2), a lophine dimer (3), an energy transfer dye, and an oxygen scavenger provides an especially sensitive and rapid initiating system.

In another aspect, the invention involves a process for making images in a photopolymerizable layer which comprises exposing to actinic light selected portions of the photopolymerizable layer containing the three, four or five-component system until substantial addition polymerization occurs in the exposed areas of said layer with substantially no polymerization in the unexposed portions of the layer and removing said latter portions with a development operation. The development may be accomplished by solvent washout, thermal transfer, pressure transfer, application of pigments to unpolymerized areas, differential adhesion of the exposed vs. unexposed areas, etc. The development will produce either a relief surface or an image on a separate receptor. Schlieren optics or other physical means can also be used to distinguish between polymerized and unpolymerized image areas.

In the multi-component initiating system of the invention, the photopolymerizable thermoplastic layer is usually composed of a thermoplastic polymer as the binder, e.g., cellulose acetate, cellulose acetate butyrate, etc., to which is added a monomer which is ethylenically unsaturated and suitable for free radical initiated, chain-propagating addition polymerization, e.g., pentaerythritol triacrylate, polyethyleneglycol diacrylate, triethyleneglycol diacrylate, polyethyleneglycol dimethacrylate, polymethylene diacrylate, polymethylene dimethacrylate, trimethylolpropane triacrylate and trimethyleneglycol dimethacrylate.

The cross-linkable polymer as disclosed in Schoenthaler application Ser. No. 451,300, Apr. 27, 1965, now Patent No. 3,418,295 can be used in lieu of the monomer-binder combination. When the monomer-binder is in solution in a suitable solvent, i.e., acetone, methanol, methylene chloride, water, etc., the 2,4,5-triphenylimidazole dimer and the free radical producing agent are added while in liquid form, e.g., the dimer and agent are in acetone, methanol, etc. The solution is then stirred or mixed and coated on a support by prior art coating methods.

The 2,4,5-triphenylimidazolyl dimers having an ortho substituent on the 2-phenyl ring were found to be particularly useful as components of the initiating system because of their stability. Such a dimer is 2-o-chlorophenyl - 4,5-diphenylimidazolyl dimer, 2 - (o-fluorophenyl) - 4,5 - diphenylimidazolyl dimer, or 2 - (o - methoxyphenyl)4,5-diphenylimidazolyl dimer.

Other dimers, either unsubstituted or substituted were also found to be useful. Examples of other dimers are 2-(p-methoxyphenyl) - 4,5 - diphenylimidazolyl dimer, 2,4-di(p - methoxyphenyl) - 5 - phenylimidazolyl dimer, 2-(2,4-dimethoxyphenyl) - 4,5 - diphenylimidazolyl dimer, 2-(p - methyl mercapto phenyl) - 4,5 - diphenylimidazolyl dimer, hexaphenyl lophine dimers or bis(2,3,5 - triphenylimidazolyl) dimers, (isomer A, max. at 270 mμ, isomer B, max. at 280 mμ).

Suitable lophine dimers are disclosed in British patent specifications 997,396 pub. July 7, 1965, and 1,047,569 pub. Nov. 9, 1966.

The free radical producing agent must be one that forms a stable system with the lophine dimer in the dark. The agent can be an amine, e.g., a tertiary amine. The amine-substituted leuco dyes are useful, especially those having at least one dialkylamino group. Also, any leuco triphenylamine dye or various salts of the dye, e.g., the HCl salt of the leuco blue dye can be used. Illustrations of suitable dyes include tris - (4-N,N-diethylamino-o-tolyl)-methane trihydrochloride, bis(4 - N,N-diethylamino - o-tolyl)trienylmethane, bis(4 - N, N - diethylamino-o-tolyl) methylenedioxyphenylmethane, leuco neutral shade dye, i.e., bis(4 - N,N - diethylamino - o - tolyl) - benzyl thiophenylmethane, Leuco Malachite Green (C.I. Basic Green 4), leuco forms of Crystal Violet, Brilliant Green (C.I. Basic Green 1), Victoria Green 3B (C.I. Basic Green 4), Acid Green GG (C.I. Acid Green 3), Methyl Violet (C.I. Basic Violet 1), Rosaniline (C.I. Basic Violet 14), etc. The salt forms, e.g., HCl salt, salts with Lewis acids, sulfuric acid salts, p-toluene sulfonic acid salts, etc. of the leuco dye is preferred for use.

Additional suitable, free radical producing agents which can be used singly or in combination include aniline, N-methylaniline, N,N-diethylaniline, N,N-diethylcresidine, triethanolamine, ascorbic acid, 2-allylthiourea, sarcosin, N,N - diethylglycine, trihexylamine, diethylcyclohexylamine, N,N,N',N' - tetramethylethylenediamine, diethylaminoethanol, ethylaminoethanol, N,N,N',N'-ethylenediaminotetracetic acid, N-methylpyrrolidone, N,N,N',N'',N''-pentamethyldiethylenetriamine, N,N - diethylxylidene, N,N'-dimethyl-1,4-piperazine, N - β - hydroxyethylpiperidine, N-ethylmorpholine, and related amino compounds. While the tertiary amines and especially the aromatic tertiary amines having at least one $CH_2$ group adjacent to the nitrogen atoms are preferred, a combination of two radical generating agents such as a tertiary amine, e.g., N,N-dimethylaniline, and a secondary amine, e.g., N-phenylglycine, appear especially useful for photoinitiation.

In a 3-component system containing monomer constituent (1), at least one radical-producing agent (2) and a lophine dimer (3), it was found that the light-sensitivity or speed or polymerization was dependent upon the concentration of dimer and the free radical-producing agent. The useful concentration may be limited in part by the solubilities of the initiating components in the monomer-binder coating composition. It was discovered that the speed increased up to a certain concentration of dimer and agent, and an increase of the concentration past that level did not produce any increase in speed and in some instances the speed dropped. Thus, when leuco dye was used as the free radical producing agent, a ratio of leuco dye to the dimer of 1:2 gave the best results as to photospeed and aging behavior. For example, in a monomer-binder composition in acetone having a weight of 5.0 g., the maximum light sensitivity was reached with a concentration of 80 mg. of leuco triphenylmethane dye and 160 mg. of the dimer.

After the monomer-binder solution containing the lophine dimer and the free radical producing agent have been stirred sufficiently, the solution is coated on a support and allowed to dry. The compositions can be thoroughly mixed by the aid of any conventional mixing or milling apparatus. If desired, a cover sheet, such as described in Heiart, U.S. Patent 3,060,026, can be laminated to the photopolymerizable layer, or the layer can be overcoated with a wax layer such as described in Burg U.S. 3,203,805, Aug. 31, 1965 or a layer of polyvinyl alcohol or gelatin can be coated as described in Alles U.S. Ser. No. 560,889, June 27, 1966. The photopolymerizable layer may contain the pigments or dyes described in Burg et al. 3,060,023. The multi-component system of this invention enables polymerization to be initiated by longer wavelengths, visible light than has been possible heretofore.

The addition of another dye that is a light energy transferring dye as an additional initiating component in the compositions of the invention has advantages. This dye has been referred to above and in the claims as an energy-transfer dye and should extend the spectral sensitivity of the composition into the visible region of the spectrum and increase the speed of the composition. This transfer dye, as previously stated, should be effective in transferring light energy to the lophine dimer.

Useful energy-transfer dyes are those of the xanthene class, e.g., Fluorescein (C.I. Acid Yellow 73), 4,5-dibromofluorescein, Eosin Y (C.I. Acid Red 87), Erythrosin B (C.I. Acid Red 51), Rose Bengal (C.I. Acid Red 94), Phloxine (Lauth's Violet—C.I. 5200); and those of the acridine class such as acriflavine; the spectral sensitivity can be further extended to longer wavelengths (4500A) by use of a dye such as Riboflavine. The important requirement or function of the dye is that it be effective in transferring the visible light energy to the ultraviolet absorbing lophine dimer. These dyes may be used in combination with one another and it is especially useful to employ dye mixtures in systems wherein panchromatic response is desired.

Photoreducible dyes that have the light energy transfer properties recited above constituted a useful class of dyes.

Of course, the light sensitivity of the four-component system is strongly dependent upon the concentration of the lophine dimer, leuco dye, and the energy-transfer dye. As with the three-component system, maximum photospeed is obtained when the ratio by weight of leuco dye to the dimer is 1:2. Maintaining the leuco dye/dimer at this constant concentration, the optimum energy-transfer dye concentration for maximum photospeed can be determined. At too high a concentration of the energy-transfer dye, the dye becomes an inhibitor, possibly by strong attenuation of the actinic light or by self quenching. For example, in a coating solution, e.g., monomer, binder, solvent, etc., of 5.0 g., the maximum visible light sensitivity and the highest photographic speed were obtained with a concentration of 10.0 mg. of energy-transfer dye (Erythrosin), 80 mg. of the leuco dye and 160 mg. of the lophine dimer. Other electron donor agents can be used in like concentrations.

The four-component initiating system is capable of camera exposure, e.g., a camera exposure of 17 seconds at *f*/3.5 in bright sunlight produces a high contrast picture on thermal transfer development. Additionally, the system is capable of projection type exposures, i.e., enlargements, of microfilm originals with conventional tungsten light sources. One embodiment of this system upon exposure and thermal transfer development was found to have an ASA speed number of .004.

Upon addition of 2-allyl thiourea, 1-allyl-2-thiourea, dimethyl sulfoxide, stannous chloride, N-phenylglycine or an organic mercaptan to the polymerizable system, the photographic speed is greatly increased. As previously mentioned, these compounds act as oxygen scavengers and as a result reduce the inhibiting effect of oxygen on the polymerization. The speed of such systems is proportional to the concentration of the oxygen scavenger; however, above a certain concentration (e.g., 600 mg. of 2-allyl thiourea for 5.0 g. of coating solution) the oxygen scavenger crystallizes or thermal polymerization takes place.

The structure of some of the lophine dimers named above was given in the original specification of my prior application Ser. No. 531,784, filed Mar. 4, 1966.

The invention in its various aspects will be further illustrated but is not intended to be limited by the following examples.

Example I

A standard solution was prepared from 110.0 g. of a 10% by weight solution in acetone of cellulose acetate butyrate, 32.5 g. of a 10% by weight solution in acetone of cellulose acetate, 30.0 g. of pentaerythritol triacrylate, 2.0 g. of polyethylene oxide having an average molecular weight of 4000 (available from Union Carbide as "Carbowax® 4000") in 14 ml. of methanol and acetone to make 200.0 g. The cellulose acetate butyrate contained 20.5% acetyl groups, 26% butyryl groups, 2.5% hydroxyl groups and had a viscosity of 9.0–13.5 poises determined by ASTM method D–1343–54T in a solution described as Formula A, ASTM method D–871–54T. The cellulose acetate contained 39.4% acetyl groups and 55% combined acetic acid and had a viscosity of 130–182 poises determined by ASTM method D–1343–56 in a solution described as Formula A, ASTM method D–871–56.

The 5.0 g. of the above solution, 80 mg. of the (2-o-chlorophenyl 4,5-diphenylimidazolyl) dimer and 100 mg. of carbon tetrabromide were added. The solution was then stirred and coated on a 0.001-inch support of polyethylene terephthalate to a wet coating thickness of 0.006 inch and the coating dried. The support was subcoated with vinylidene chloride/methyl acrylate/itaconic acid copolymer as described in Alles et al., U.S. 2,779,684. After 30 minutes drying at room temperature, a 0.001-inch film of polyethylene terephthalate was laminated to the coating.

The sandwich was placed in contact with a process original and exposed to a photoflood lamp at a distance of 16 inches for 30 seconds.

The exposed sample was then delaminated and developed by thermal transfer, i.e., development such as described in Burg et al., U.S. Patent 3,060,023. The delaminated sample was placed in contact with a paper receptor sheet and passed between a pair of rollers heated to 125° C.

The underexposed areas in the photopolymer layer transferred to the receptor sheet forming a well defined, high contrast image on the paper. This result indicates that a 2,4,5-triphenylimidazole dimer in combination with carbon tetrabromide, a free radical producing agent, initiates photopolymerization.

Example II

A standard solution was prepared from 110.0 g. of a 10% by weight solution in acetone of cellulose acetate butyrate, 52.5 g. of a 10% by weight solution in acetone of cellulose acetate, 36.0 g. of pentaerythritol triacrylate, 2.0 g. of polyethylene oxide having an average molecular weight of 4000 (available from Union Carbide as "Carbowax® 4000") in 14 ml. of methanol, 100 mg. of Erythrosin (C.I. Acid Red 51) and acetone to make 220.0 g. The cellulose acetate butyrate contained 20.5% acetyl groups, 26% butyryl groups, 2.5% hydroxyl groups and had a viscosity of 9.0–13.5 poises determined by ASTM method D–1343–54T in a solution described as Formula A, ASTM method D–871–54T. The cellulose acetate contained 39.4% acetyl groups and 55% combined acetic acid and had a viscosity of 130–182 poises determined by ASTM method D–1343–56 in a solution described as Formula A, ASTM method D–871–56.

Sample A was prepared by adding to 5.5 g. of the standard solution, 0.15 g. of 2-allyl thiourea in 1 ml. of acetone and stirring the resulting solution. This sample served as the control since it was an example of a photoreducible dye-reducing agent combination known in the art.

Sample B was prepared by adding to another 5.5 g. of the standard solution, 0.15 g. of 2-allyl thiourea in 1 ml. of acetone, 80 mg. of the leuco dye, tris (4-N,N-diethylamino-o-tolyl) methane trihydrochloride in 1 ml. of methanol, and 80 mg. of the lophine, (2-o-chlorophenyl, 4,5-diphenylimidazolyl) dimer in 1 ml. of acetone.

Sample C was prepared by adding to another 5.5 g. of the standard solution, 0.15 g. of 2-allyl thiourea in 1 ml. of acetone, 40 mg. of the leuco dye, tris (4-N,N-diethylamino-o-tolyl) methane trihydrochloride in 1 ml. of methanol, and 150 mg. of the lophine, (2-o-chlorophenyl-4,5-diphenyl imidazolyl) dimer in 1 ml. of acetone.

Sample D was the same as Sample B, except that 5 mg. of Erythrosin (C.I. Acid Red 51) was added to the solution prior to coating.

Another solution was prepared adding 5 mg. of erythrosin, 40 mg. of the leuco dye in methanol, and 80 mg. of the lophine dimer in acetone to 6.5 g. of the standard solution. To this solution 600 mg. of 2-allyl thiourea in acetone was added, and this labeled Sample E.

After the additions, the above sample solutions were stirred for two hours. The solutions were then each coated on a 0.001-inch support of polyethylene terephthalate with a sub coating as described in Example I, to a wet coating thickness of 0.006-inch on a board coater using a doctor knife. After 30 minutes drying at room temperature to evaporate the solvents, a 0.001-inch film of polyethylene terephthalate was laminated to the coating such as described in Heiart U.S. Patent 3,060,026.

The samples were then exposed to a 220-volt, 70-amp. standing carbon arc at a distance of 16 inches. The photopolymerizable element was mounted in a glass walled printing frame behind a $$\sqrt[6]{2}$$

neutral density sensitometric stepwedge. After exposure and development, a relative exposure number was determined based on the amount of exposure required to prevent thermal transfer. This number is useful in comparing the speeds produced by the various initiating system, particularly with respect to development by thermal transfer.

This arbitrary speed number or relative minimum exposure is defined as $I'\times t$ (sec.) where I' is the light intensity that caused polymerization in $t$ seconds. The light attenuation through the sensitometric stepwedge was expressed as $\log I'=\log I-D$ where I is the light intensity of the carbon arc, arbitrarily called 100, and D is the density of the wedge at the transfer/no transfer step of the thermal transfer development. So $I'=\text{antilog}\ (2-.05\ N)$, N being the number of steps polymerized and .05 the density difference between any two consecutive steps of the wedge.

The intensity values for the thirty steps of the wedge were tabulated and are set out as follows.

TABLE I

I' values: Light attenuation through the $\sqrt[6]{2}$ wedge
$I'=\text{antilog}\ (2-.05\ N)$

| N | I' | N | I' |
|---|---|---|---|
| 1 | 89.2 | 16 | 15.4 |
| 2 | 79.5 | 17 | 14.2 |
| 3 | 70.8 | 18 | 12.9 |
| 4 | 63.1 | 19 | 11.3 |
| 5 | 56.3 | 20 | 10.0 |
| 6 | 50.1 | 21 | 8.9 |
| 7 | 44.6 | 22 | 8.0 |
| 8 | 39.9 | 23 | 7.1 |
| 9 | 35.5 | 24 | 6.3 |
| 10 | 31.7 | 25 | 5.6 |
| 11 | 28.2 | 26 | 5.0 |
| 12 | 25.2 | 27 | 4.5 |
| 13 | 22.4 | 28 | 4.0 |
| 14 | 20.0 | 29 | 3.5 |
| 15 | 17.8 | 30 | 3.2 |

As can be observed, the scale is inverted and the smaller the speed number, the faster the speed of polymerization.

The exposures were made to the full output of the carbon arc, and also through a Wratten #12 Gelatin Filter which cut out all light below 500 mμ. The exposure to the full output was for ½ second while the exposure through the filter was for 2 seconds.

The exposed samples were then delaminated and developed by thermal transfer. The delaminated samples were placed face down on the receptor sheet and the sandwich was passed through a pair of hot rolls (125–140° C.) which exerted a pressure of 3 lb. per lineal inch. The nonpolymerized areas transferred to the receptor sheet, the polymerized areas remaining on the polyethylene terephthalate support.

The exposure numbers were obtained as previously described and were tabulated as follows:

| Initiating System | Relative Exposure Number | |
|---|---|---|
| | No Filter | #12 Filter |
| Sample: | | |
| A—2-allyl thiourea, erythrosin | 147 | 306 |
| B—2-allyl thiourea, erythrosin leuco dye, dimer. | 6 | 31 |
| C—do | 4 | 31 |
| D—do | 7 | 20 |
| E—do | 1.8 | 39.9 |

Additional coatings identical with sample B were prepared. One coating was held in the printing frame and given a reflex exposure to the step wedge by one flash of an electronic flashgun (45 watt-seconds input) at 5 cm. Thermal transfer development of the coating indicated that the flash initiated polymerization.

Another coating was exposed in a camera to an original consisting of white paper strips on a black background. The exposure was in direct sunlight at $f/3.5$ for periods between 15 and 30 seconds. After thermal transfer development, reproductions of the original were produced on a paper receptor.

Another coating was exposed through a slide with a A. O. Spencer Model 6K Deleneascope, 750-watt, 12" focal length, $f/3.5$ lens projector at a distance of 6 feet for 5 seconds. After thermal transfer development, a reproduction of the slide magnified 4 times was produced on the receptor.

A coating identical with sample D was exposed in a camera to a magazine page. The exposure was for one minute in bright sunlight at *f*/3.5. Thermal transfer development produced a reproduction of the page.

Example III

A coating solution was prepared from 0.14 g. of a 10% by weight solution in acetone of cellulose acetate butyrate, .09 g. of a 10% by weight solution in acetone of cellulose acetate, .45 g. of pentaerythritol triacrylate, .02 g. of polyethylene oxide having an average molecular weight of 4000 in methanol and acetone to make 2.75 g.

The cellulose acetate-butyrate contained 20.5% acetal groups, 26% butyryl groups, 2.5% hydroxyl groups and had a viscosity of 9.0–13.5 poises determined by ASTM method D–1343–54T in a solution described as Formula A, ASTM method D–871–54T. The cellulose acetate contained 39.4% acetyl groups and 55% combined acetic acid and had a viscosity of 130–182 poises determined by ASTM method D–1343–56 in a solution described as Formula A, ASTM method D–871–56.

To this solution, 35 mg. of the free base leuco neutral shade dye, bis(4-N,N-diethylamino-o-tolyl) benzyl thiophenylmethane in methanol and 76 mg. of the lophine dimer, bis(2,4,5-triphenylimidazole), isomer B, λ max. of 280 mμ, in methylene chloride was added.

The solution was stirred, coated, and exposed as in Example II, except that the filter used (#2C) was one that cut off radiation below 400 mμ. After exposure, the coating was developed by thermal transfer as described in Example I.

The result indicated that polymerization was initiated by the leuco dye-lophine dimer and the exposure number for direct exposure was 4.0 while that for exposure through the #2C filter was 16. These relative exposure numbers indicate that this two component exposure system has an approximate ASA speed number of 0.002.

Example IV

A standard solution was prepared as set forth in Example II, except that 200 mg. of erythrosin (C.I. Acid Red 51) was used instead of 100 mg.

To 5.5 g. of the standard solution, 5 mg. of erythrosin in one ml. of methanol, 160 mg. of the 2-o-chlorophenyl, 4,5-diphenylimidazole dimer in 2 ml. of methanol, and 80 mg. of the leuco blue dye, tris(4-N,N-diethylamino-o-tolyl) methane trihydrochloride were added.

In this example, the HCl salt of the leuco dye was used. The HCl salt was made by bubbling HCl gas through an ether solution containing the dye. The ether was evaporated and the resulting crystals were dried over phosphorus pentoxide ($P_2O_5$).

The resulting solution was coated, exposed and developed as set forth in Example II. The relative exposure number for the direct exposure of this three component initiating system was 2.5 while that through the #12 filter was 44.6. The relative exposure number 2.5 is approximately equivalent to an ASA speed number of .004.

Additional samples were prepared and one sample was exposed to a microfilm through a 750-watt projector for 2 minutes. The result was a sharp image on a receptor which was a 9× enlargement of the microfilm original.

Another sample was exposed in a camera for 17 seconds at *f*/3.5 in bright sunlight to produce a high contrast picture on thermal transfer.

Example V

A standard solution was prepared as set forth in Example I; to 2.75 g. of this solution, 5 mg. of erythrosin in methanol, 35 mg. of the HCl salt of the leuco neutral shade dye, bis(4-N,N-diethylamine-o-tolyl) benzyl thiophenylmethane in methylene chloride and 88 mg. of 2,4-di(p-methoxyphenyl)-5-phenyl imidazolyl dimer in methylene chloride were added.

The resulting solution was coated as set forth in Example II. The coating was dried at room temperature and allowed to age for one day. The coating was then exposed as set forth in Example II except that a #2C filter, as described in Example III, was used and the exposure was for 0.25 second.

The relative exposure number for the direct exposure was 1 while that through the #2C filter was 2. Thus the ASA speed number of this initiating system is approximately .01.

Other samples of this coating were exposed in a camera for periods between 5 and 10 seconds at *f*/3.5 in bright sunlight. The thermal transfer development of the samples produced sharp images on the receptors.

Example VI

To demonstrate the utility of various energy transfer dyes in the four-component system, the following procedure was followed.

A standard solution was made as set forth in Example I. To 2.75 g. of this solution, 40 mg. of the 2-o-chlorophenyl-4,5-diphenylimidazolyl dimer in methanol and 20 mg. of the HCl salt of the leuco blue dye, tris (4-N,N-diethylamino-o-tolyl) methane trihydrochloride in methanol were added.

To two other parts of 2.75 g. each of the standard solution, 40 mg. of the dimer, 20 mg. of the leuco dye and 5 mg. of two other energy-transfer dyes were added; the dyes added are set forth in the table of results.

To three other parts of 2.75 g. each 160 mg. of the dimer, 80 mg. of the leuco dye and 2.5 milligrams of other energy-transfer dyes were added. The amount of, and dyes added are set out in the table of results.

The individual solutions were coated, exposed for one second directly to the carbon arc, and developed as set forth in Example II to give the following results.

| Energy-transfer dye | Amount, mg. | Relative Exposure Number |
|---|---|---|
| None | | 63 |
| Erythrosin (C.I. Acid Red 51) | 5.0 | 25 |
| Methylene Blue (C.I. Basic Blue 9) | 5.0 | 41 |
| Phloxin B (C.I. Acid Red 92) | 2.5 | 10 |
| Eosin Y (C.I. Acid Red 87) | 2.5 | 11 |
| 4,5-dibromofluorescein | 2.5 | 10 |

Example VII

To demonstrate the use of various dimers with the salt form of the leuco dye, the following procedure was followed.

A coating solution was made as set forth in Example 1. Part of this solution was divided into seven parts of 2.75 g. each. To each of the 7 parts, 10 mg. of erythrosin and 40 mg. of the HCl salt of the leuco blue dye, tris (4-N,N-diethylamino-o-tolyl) methane trihydrochloride in methanol were added.

To each of the samples a different dimer in methylene chloride was added. The particular dimer added is set forth in the table of results.

The 7 parts were coated, exposed, and developed as set forth in Example II to give the following results.

| Dimer | Amount, mg. | Relative exposure number: Direct | #2C Filter | #12 Filter |
|---|---|---|---|---|
| 2-o-chlorophenyl,4,5-diphenylimidazolyl dimer | 80 | 15 | 41 | 80 |
| 2-o-fluorophenyl-4,5-diphenylimidazolyl dimer | 76 | 25 | 80 | 290 |
| 2-o-methoxyphenyl, 4,5-diphenylimidazolyl dimer | 78 | 13 | 41 | 80 |
| 2-p-methoxyphenyl, 4,5-diphenylimidazolyl dimer | 82 | 70 | 160 | 2,000 |
| 2-p-methylmercaptophenyl 4,5-diphenylimidazolyl dimer | 84 | 15 | 61 | 2,000 |
| Bis 2,4,5-triphenylimidazolyl isomer A | 76 | 22 | 42 | 92 |
| Bis 2,4,5-triphenylimidazolyl isomer B | 76 | 160 | 560 | 2,000 |

Example VIII

To demonstrate the use of various dimers with the free base leuco dye, the following procedure was followed.

A standard solution was made as set forth in Example I. Three portions of 2.75 grams each were then separated. To each of the 3 parts, 5 mg. of erythrosin and 35 mg. of the free base of leuco neutral shade dye, bis (4-N,N-diethylamino-o-tolyl) benzyl thiophenylmethane were added. To each of these parts, a different dimer in methylene chloride was added; the particular dimer added is indicated in the table.

The three parts were coated, exposed, and developed as set forth in Example II to give the following results.

| | | Relative exposure number | | |
|---|---|---|---|---|
| Dimer | Amount, mg. | Direct | #2C Filter | #12 Filter |
| 2,4-di-(p-methoxyphenyl)imidazolyl dimer | 88 | 12 | 45 | 148 |
| 2-p-methyl mercaptophenyl-4,5-diphenylimidazolyl dimer | 84 | 7 | 20 | 70 |
| Bis 2,4,5-triphenylimidazolyl isomer B | 76 | 17 | 64 | 2,000 |

Example IX

A standard solution was made as described in Example I. To four portions of 2.75 g. each of the standard solution, 5 mg. of erythrosin and 80 mg. of the (2-o-chlorophenyl, 4,5-diphenylimidazolyl) dimer in methylene chloride were added. To each of these parts, a different free base leuco dye in methanol was added; the particular dye added is indicated in the table.

The parts were coated, exposed to both #2C and #12 filters, and developed as set forth in Example II to give the following results.

| | | Relative exposure number | | |
|---|---|---|---|---|
| Leuco Dye | Amount, mg. | No Filter | #2C | #12 |
| Tris (4-N,N-diethylamino-o-tolyl) methane trihydrochloride | 40 | 17 | 32 | 80 |
| Bis (4-N,N-diethylamino-o-tolyl) thienylmethane | 28 | 28.5 | 92 | 560 |
| Bis (4-N,N-diethylamino-o-tolyl) methylene dioxyphenylmethane | 30 | 36 | 133 | 723 |
| Bis (4-N,N-diethylamino-o-tolyl) benzyl thiophenylmethane | 35 | 36 | 105 | 663 |

Example X

Four coating solutions were made with different polymerizable monomers as follows:

(1)

0.5 g. of polyethylene glycol diacrylate
0.5 g. of a 10% by weight solution in acetone of cellulose acetate
2.0 g. of a 10% by weight solution in acetone of cellulose acetate butyrate
10 mg. of erythrosin
40 mg. of HCl salt of the leuco blue dye, tris-(4-N,N-diethylamino-o-tolyl) methane in methanol
80 mg. of the (2-o-chlorophenyl-4,5-diphenylimidazolyl) dimer in methylene chloride (2)

0.5 g. of triethylene glycol diacrylate
0.5 g. of 10% by weight solution in acetone of cellulose acetate.
2.0 g. of a 10% by weight solution in acetone of cellulose acetate butyrate
10 mg. of erythorsin
40 mg. of the HCl salt of the same leuco blue dye in methanol
80 mg. of the same dimer in methylene chloride (3)

0.5 g. of polyoxyethylated trimethylolpropane triacrylate (having an average molecular weight of 1662).
1.0 g. of the 10% cellulose acetate in acetone
2.0 g. of the 10% cellulose acetate butyrate in acetone
10 mg. of erythrosin
40 mg. of the HCl salt of the leuco dye
80 mg. of the dimer
.0005 g. of p-methoxyphenol (4)

0.6 g. of polytetramethylene glycol diacrylate, $CH_2{=}CHCO(-OCH_2CH_2CH_2CH_2)_n-OCOCH{=}CH_2$ ($n\sim16$) (having an average molecular weight of 1400)
1.5 g. of 10% cellulose acetate butyrate
1 ml. of acetone
10 mg. of erythrosin
40 mg. of the HCl salt of the leuco dye
80 mg. of the dimer
.0006 g. of p-methoxyphenol The cellulose acetate and cellulose acetate butyrate were the same as those used in Example I.

The four solutions were coated, exposed directly to the carbon arc and developed as set forth in Example II to give the following results.

| Coatings: | Relative exposure number |
|---|---|
| 1 | 80 |
| 2 | 61 |
| 3 | 470 |
| 4 | 160 |

The results indicate that the three component system is capable of initiating all the monomers. The slower speeds with coatings 3 and 4 are due to the presence of the thermal inhibitor, p-methoxyphenol.

Example XI

A standard solution was prepared as set forth in Example I.

To 15.0 g. of this solution, the following was added:

30 mg. erythrosin
120 mg. of the HCl salt of the leuco blue dye, tris (4-N,N-diethylamino-o-tolyl) methane trihydrochloride in methanol
240 mg. of the (2-o-chlorophenyl-4,5-diphenyl imidazolyl) dimer in acetone
90 mg. of stannous chloride
to 20.0 g. with methanol and acetone.

A second coating solution, solution B, was prepared by adding the following to 2.75 g. of the standard solution:

0.10 g. of polyethylene glycol diacrylate
10 mg. erythrosin
70 mg. of the free base of the leuco neutral shade dye, bis (4-N,N-diethylamino-o-tolyl) benzyl thiophenylmethane in methanol
160 mg. of the (2-o-chlorophenyl-4,5-diphenylimidazolyl) dimer in acetone
30 mg. of stannous chloride The two coating solutions were coated, exposed, and developed as described in Example II. Sample B was only exposed directly to the carbon arc while Sample A was exposed also to the #12 filter. The results are as follows:

| | Relative Exposure Number | |
|---|---|---|
| | No Filter | #12 Filter |
| Coating: | | |
| A | 0.4 | 3.2 |
| B | 0.18 | ---------- |

A coating, identical with Sample A was exposed in a camera to an object. The exposure was for 6 seconds in cloudy weather at $f/3.5$. Thermal transfer development produced a reproduction of the object.

Another coating identical with Sample A was exposed to the carbon arc at 16 inches for ½ second. The sample was mounted in a printing frame and exposed to a continuous tone negative. Thermal transfer development produced a reproduction of the negative.

Other coatings identical with Sample A were exposed in an Edgerton-Germeshausen Grier Flash Sensitometer to a $\sqrt{2}$ step wedge. One exposure was for 1/1000 second at 7000 meter candles. Another coating was exposed twice at 1/10,000 second at 130 meter candles. Both of these exposures were capable of initiating polymerization.

A coating identical with Sample B was exposed in a camera at *f*/3.5 for 3 seconds to produce an image on thermal transfer. Two photoflood lamps were used for illumination.

The ASA speed number for the samples of the five-component system using stannous chloride as the fifth component is approximately 0.1.

Example XII

Three grained aluminum lithographic printing plates were coated with a 32–35% by weight solution in 2-ethoxyethanol of the following composition:

| | Percentage of weight |
|---|---|
| Poly[methyl methacrylate/methacrylic acid] (90/10 mole ratio) [1] | 54.1 |
| Trimethylolpropane triacrylate | 40.7 |
| 2-o-chlorophenyl - 4,5 - bis(m-methoxyphenyl)imidazolyl dimer | 2.0 |
| Tris-(4-diethylamino-o-tolyl)methane | 1.2 |
| p-Toluenesulfonic acid | 0.7 |
| 7-diethylamino-4-methylcoumarin | 0.9 |
| 2-mercaptobenzothiazole | 0.3 |
| CI Solvent Red 109 dye | 0.1 |

Approximate coating weight, solids 45 mg./dm.$^2$.

[1] Intrinsic viscosity=0.094 using methyl ethyl ketone as solvent.

The plates were dried at 115° C. for 1.5 minutes and cooled.

Plate No. 1 received no overcoating.

Plate No. 2 was overcoated with a 6% by weight aqueous solution of polyvinyl alcohol (medium viscosity, 88% saponified) containing 0.12% of a polyoxyethylene surfactant of the formula

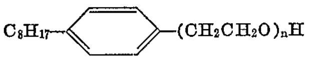

where *n* is 9 to 10. Coating weight was about 6 mg./dm.$^2$

Plate No. 3 was overcoated, at a solid coating weight of about 20 mg./dm.$^2$ from the following aqueous solution:

| | Percentage by weight |
|---|---|
| Polyvinylpyrrolidone (M.W. about 40,000) | 7.87 |
| Polyvinyl alcohol (same as Plate No. 2) | 5.27 |
| Ethanol | 3.15 |
| 2-ethoxyethanol | 3.68 |
| Surfactant (same as for Plate No. 2) | 0.13 |
| Water | 79.90 |

The plates were exposed and processed as in Example I of Alles, Ser. No. 560,889 except that the time of soaking in developer was increased from 30 to 60 seconds and the developer was an aqueous solution containing the following ingredients:

| | | |
|---|---|---|
| Sodium phosphate dodecahydrate | percent by wt | 2.5 |
| Sodium dihydrogen phosphate monohydrate | do | 0.44 |
| Isooctylphenylphenoxyethanol in water (10% soln.) | percent by vol | 0.20 |
| 2-butoxyethanol | do | 4.5 |
| Sodium hexametaphosphate | percent by wt | 1.2 |

The plates were evaluated as in Example I of the Alles application and found to be essentially equivalent. They showed good ink/water characteristics, i.e., the exposed photopolymerized areas readily accepted lipophilic inks while the area of the support from which unexposed photopolymerizable material had been removed accepted water readily. The plate ran satisfactorily on a wet offset press using a black printing ink and fountain solution. Plate No. 1, without an overcoat, was photographically somewhat slower than Plates No. 2 and No. 3 but the difference in speed was far less noticeable than in the examples of the above Alles application wherein photopolymerization was initiated by quinone compounds. Initiation by an imidazolyl dimer as in the present invention overcomes most of the problem of oxygen inhibition of polymerization so that an oxygen barrier overcoating becomes considerably less important. In fact, because of simpler production, plates without oxygen barrier overcoats could represent the preferred embodiment.

Example XIII

The following stock solution was prepared:

| | | |
|---|---|---|
| Trichloroethylene | ml | 80 |
| Acetone | ml | 20 |
| Polymethylmethacrylate (Inherent viscosity [1]=0.20) low mol. wt. | g | 9.0 |
| Polymethylmethacrylate (Inherent viscosity [1]=1.20) very high mol. wt. | g | 3.0 |
| Trimethylolpropane triacrylate | ml | 9.2 |
| 2-o-chlorophenyl-4,5-diphenylimidazoyl dimer | g | 1.0 |

[1] Inherent viscosity of a solution containing 0.25 g. polymer in 50 ml. chloroform, measured at 20° C., using a No. 50 Cannon-Fenske viscometer.

To 15 ml. of a stock solution as described above, there was added 70 mg. of the hydrogen donor compound, N-phenylglycine. The resulting solution was coated on 0.001-inch thick biaxially oriented polyethylene terephthalate film with a doctor knife set at an opening of 0.006-inch. After drying for 30 minutes, another film of 0.001-inch thick polyethylene terephthalate was laminated over the coating. The laminated element was exposed through a square-root-of-two step wedge using a black backing in a contact frame. The exposing radiation was a 275-watt mercury vapor Westinghouse RS Sunlamp, at such distance and so adjusted as to give a diffuse light meter reading (Gossen CdS Super Pilot) of EV (exposure value) of 10 at ASA 50 against a white paper.

Samples of the freshly prepared laminated element received four types of exposures which varied as follows:

(1) 1 minute
(2) 1 minute with 10 sec. post-heating at 120° C.
(3) 5 minutes
(4) 5 minutes with 10 sec. post-heating at 120° C.

With other samples of the element the above exposures were repeated when the element had aged for one day and again for one week following preparation. Thus a total of 12 samples were tested of the film containing N-phenylglycine as the hydrogen donor compound.

The exposed film samples were stripped of their cover sheet and developed for 1 minute with 1,1,1-trichlorethane while scrubbing with cotton to remove the unpolymerized areas. Relative effectiveness of the hydrogen donor was estimated from the number of steps held, i.e., the number of step areas from the square-root-of-two step wedge exposure wherein polymerization occurred to an extent sufficient to prevent the stratum within that area from being removed during the treatment (development) with 1,1,1-trichlorethane. N-phenylglycine is an excellent hydrogen donor and it was found that, with 5 minutes exposure, there were 11 to 14 steps out of a possible total of 21 which held.

Many other hydrogen donor compounds were used in a similar manner, in each case adding 70 mg. (or 70$\mu$ l. if a liquid) of the hydrogen donor to 15 ml. of the stock solution. Each solution was coated, dried and laminated with 12 samples of each laminated element being exposed as described above. Where indicated by an asterisk, the stock solution contained 100 ml. of acetone instead of the 20 ml. acetone+80 ml. trichloroethylene described originally.

Results are tabulated on the following chart in an approximately decreasing order of effectiveness of the hydrogen donors tested:

| | Exposure | | | | | | | | | | | |
|---|---|---|---|---|---|---|---|---|---|---|---|---|
| | 1 Min., No Heat | | | 1 Min., Heat | | | 5 Min., No Heat | | | 5 Min., Heat | | |
| Hydrogen Donor | Fr.[1] | 1 Day | 1 Wk. | Fr. | 1 Day | 1 Wk. | Fr. | 1 Day | 1 Wk. | Fr. | 1 Day | Wk. |
| N-phenylglycine | 4 | 4 | 3 | 9 | 9-10 | 8 | 11 | 12 | 12 | 12 | 14 | 13 |
| N-phenylglycine [2] | 7 | 4 | ------ | 10 | 10 | ------ | 13 | 12 | ------ | 15 | 15 | ------ |
| 5,5-dimethyl-1,3-cyclohexanedione | 2-3 | 2-3- | 3 | 6 | 6 | 7 | 9 | 9 | 10 | 12 | 12 | 12 |
| 4-acetamidothiophenol [2] | 4 | 4-5 | ------ | 8 | 10 | ------ | 12 | 13 | ------ | 13 | 15 | ------ |
| Pentachlorothiophenol | 3 | 3-4 | 3-4 | 7 | 7 | 8 | 10 | 11 | 11 | 12 | 12 | 13 |
| β-Mercapto-p-propionotoluidide | 3 | 3-4 | 3 | 4 | 5 | 5 | 10 | 11 | 11 | 12 | 12 | 12 |
| 2-mercaptobenzimidazole | 2 | 3 | 3-4 | 6-7 | 7 | 7 | 9 | 11 | 10 | 11 | 12 | 12 |
| 2-mercaptobenzoxazole | 2 | 2-3 | 2-3 | 5 | 5-6 | 6 | 8 | 9 | 9 | 10 | 10 | 10 |
| 2-mercaptobenzothiazole | 3-4 | 3-4 | 3-4 | 6 | 7 | 7 | 9 | 10 | 10 | 10 | 11 | 11 |
| 2-mercaptosuccinic acid | 3 | 3 | 2 | 4 | 4 | 3 | 9 | 9 | 7-8 | 10 | 10 | 8 |
| 7-diethylamino-4-methylcoumarin | 3-4 | 3-4 | ------ | 6 | 5 | ------ | 10 | 10 | ------ | 10 | 10 | ------ |
| N-cyclohexyl-2-benzothiazole sulfenamide | 3 | 3 | ------ | 4 | 4 | ------ | 8 | 8 | ------ | 9 | 9 | ------ |
| 2-mercapto-1-methylimidazole | 0 | 0 | ------ | 2 | 3 | ------ | 7 | 8 | ------ | 8 | 8 | ------ |
| Dichloroacetanilide | 0 | 1 | 1 | 2 | 3 | 3 | 5-6 | 6-7 | 6-7 | 6-7 | 7 | 7 |
| Acetoacetanilide | 0 | 0 | 1 | 1 | 1 | 2 | 5 | 5 | 6 | 6 | 6 | 7 |
| 2,2′-tolyliminodiethanol | 0 | 0 | 0 | 1 | 2 | 1-2 | 5 | 6 | 6 | 5 | 7 | 7 |
| Tri(p-diethylamino-o-tolyl)methane | 0 | 0 | 0 | 1 | 1 | 1-2 | 4 | 5 | 5 | 4 | 6 | 5-6 |
| Di(p-diethylamino-o-tolyl)phenylmethane | 0 | 0 | 0 | 1 | 1-2 | 1 | 4-5 | 5 | 4 | 6 | 6 | 6 |
| Di(p-diethylamino-o-tolyl)p-methoxyphenyl methane | 0 | 0 | 0 | 1 | 1 | 1 | 4-5 | 6 | 5 | 6 | 6 | 6 |
| Di(p-diethylamino-o-tolyl)p-isopentylthio-m-tolyl methane | 0 | 0 | 0 | 1-2 | 1-2 | 1-2 | 5 | 5 | 5 | 6 | 5-6 | 6 |
| Di(p-diethylamino-o-tolyl)-3,4-dimethoxyphenyl methane | 0 | 0 | 0 | 1-2 | 1-2 | 1-2 | 5 | 5 | 5 | 4-5 | 5-6 | 6 |
| Triethanolamine | 0 | 0 | 0 | 0-1 | 1 | 1 | 4-5 | 5 | 5 | 5 | 5 | 5-6 |
| Tri(p-dimethylaminophenyl)cyanomethane | 0 | 0 | 0 | 1 | 0 | 2 | 3 | 4 | 5 | 3-4 | 5 | 6 |
| 2-mercaptothiazoline | 0 | 0 | ------ | 1 | 1 | ------ | 5 | 5-6 | ------ | 5 | 6 | ------ |
| N-methylglycine [2] | 1 | 0 | ------ | 2 | 0 | ------ | 4-5 | 0 | ------ | 6 | 4 | ------ |
| Thiourea [2] | 0 | 0 | ------ | 0 | 0 | ------ | 4 | 4 | ------ | 4 | 4-5 | ------ |
| 1-hexadecylcylamine | 0 | 0 | ------ | 0 | 0 | ------ | 3 | 4 | ------ | 4 | 4 | ------ |
| N-phenylglycine ethyl ester | 0 | 0 | 0 | 0 | 0 | 0 | 3 | 3 | 4 | 3 | 3 | 4 |
| Allyl thiourea | 0 | 0 | 0 | 0 | 0 | 0 | 3 | 3 | 3 | 3 | 3 | 3 |
| Triphenylmethylmercaptan | 0 | 0 | ------ | 0 | 0 | ------ | 2-3 | 3 | ------ | 3 | 4 | ------ |
| N-benzylaniline | 0 | 0 | ------ | 0 | 0 | ------ | 2 | 3 | ------ | 2 | 3 | ------ |
| Malonic acid | 0 | 0 | 0 | 0 | 0 | 0 | 1 | 2 | 1 | 2 | 3 | 3 |

[1] Fr. means fresh.
[2] Stock solution contained 100 ml. acetone.

With regard to the photopolymerizable thermoplastic element, this can preferably be composed of (a) a thermoplastic polymeric compound solid at 50° C., (b) a non-gaseous ethylenically unsaturated compound containing at least one terminal ethylenic group, having a boiling point above 100° C. at normal atmospheric pressure, being capable of forming a high polymer by free-radical initiated, chain-propagating, addition polymerization and having a plasticizing action on said thermoplastic compound, constituents (a) and (b) being present in from 3 to 97 and 97 to 3 parts by weight, respectively.

The compositions are such that they do not soften at temperatures below 40° C. and do not undergo any essential change in softening temperature by holding for up to 15 seconds at the original softening temperature of the composition. The preferred photopolymerizable composition can also contain 0.001 to 2.0 parts by weight per 100 parts by weight of components (a) and (b) of a thermal addition polymerization inhibitor.

Suitable thermoplastic macromolecular binding agents include the polymerized methyl methacrylate resins, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymers), synthetic rubbers (e.g., butadiene/acrylonitrile copolymers and chloro-2-butadine-1,3 polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate), polyvinyl chloride and copolymers (e.g., polyvinyl chloride/acetate), polyurethanes, polystyrene, etc.

Other useful polymeric binders are disclosed in assignee's copending application of Schoenthaler Ser. No. 451,300 filed Apr. 27, 1965. Moreover, these unsaturated polymers can be crosslinked or can be grafted to by growing monomer chains.

While the addition polymerizable component present in the photopolymerizable element can be any monomeric ethylenically unsaturated compound capable of polymerizing or forming a high polymer in a short time by photoinitated addition polymerization as disclosed in Plambeck U.S. 2,760,863, the particularly useful compounds fall within a general class, namely, normally non-gaseous (i.e. at 20° C. and atmospheric pressure) ethylenically unsaturated monomeric compounds having one to four or more terminal ethylenic groups, a normal boiling point above 100° C., and a plasticizing action on the thermoplastic polymer. Preferably, the monomeric compounds have a molecular weight of not more than 2000.

Suitable free-radical initiated, chain-propagating addition polymerizable ethylenically unsaturated compounds for use as component (1) include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022 issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class; unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, pentaerythritol triacrylate; the bis-acrylates and methacrylates of polyethylene glycols of molecular weight 200–500, and the like; unsaturated amides, particularly those of the alpha-methylene carboxylic acids, and especially those of alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(gamma-methacrylamidopropoxy) ethane, beta methacrylamidoethyl methacrylate, N-(betahydroxyethyl)-beta-(methacrylamido) ethyl acrylate and N,N-bis (beta-methacryloxyethyl) acrylamide; vinyl esters such as divinyl succinate, divinyl adipate, divinyl phthalate, divinyl terephthalate; divinyl benzene-1,4-disulfonate, and divinyl butane-1,4-disulfonate, styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. In addition, the polymerizable, ethylenically unsaturated polymers of Burg U.S. Patent 3,043,805 and Martin U.S. Patent 2,929,710, e.g., polyvinyl acetate/acrylate, cellulose acetate/acrylate, cellulose acetate/methacrylate, N - acrylyloxymethyl polyamide, etc., may be used alone instead of component (1). In this instance, the single material serves the function of both monomer and polymer as the ethylenic unsaturation is present as an extra linear substituent attached to the thermoplastic linear polymer. Other cross-linkable polymers may also be used, e.g., polyoxyethylated trimethylol propane triacrylate, polytetramethylene glycol diacrylate, etc., disclosed in Schoenthaler U.S. application Ser. No. 451,300 filed Apr. 27, 1965.

Suitable thermal polymerization inhibitors that can be used in photopolymerizable compositions include p-methoxyphenol, hydroquinone, and alkyl- and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., Thionine Blue G (C.I. Basic Blue 25), and Toluidine Blue O (C.I. Basic Blue 17). In certain embodiments of the invention containing certain dye photoinitiators, however, no thermal inhibitor is required since these initiators have a dual function and in the dark serve as thermal inhibitors.

Various dyes, pigments, thermographic compounds and color forming components can be added to the photopolymerizable compositions to give varied results after development. These additive materials, however, preferably should not absorb excessive amounts of radiation at the exposure wave length or inhibit the polymerization reaction.

Among the dyes useful in the invention are Fuchsine (C.I. 42510), Auramine Base (C.I. 41000B), Calcoid Green S (C.I. 44090), Para Magenta (C.I. 42500), Tryparosan (C.I. 42505), New Magenta (C.I. 42520), Acid Violet RRL (C.I. 42425), Red Violet 5RS (C.I. 42690), Nile Blue 2B (C.I. 51185), New Methylene Blue GG (C.I. 51195), C.I. Basic Blue 20 (C.I. 42585), Iodine Green (C.I. 42556), Night Green B (C.I. 42115), C.I. Direct Yellow 9 (C.I. 19540), C.I. Acid Yellow 17 (C.I. 18965), C.I. Acid Yellow 29 (C.I. 18900), Tartrazine (C.I. 19140), Supramine Yellow G (C.I. 19300), Buffalo Black 10B (C.I. 27790), Naphthalene Black 12R (C.I. 20350), Fast Black L (C.I. 51215), Ethyl Violet (C.I. 20350), and Ethyl Violet (C.I. 42600).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent non-photosensitive layer.

Useful thermographic additives, e.g., 3-cyano-4,5 dimethyl-5-hydroxy-3-pyrrolin-2-one are disclosed in Howard, U.S. 2,950,987. Such compounds, in the presence of activators e.g., copper acetate, are disclosed in assignee's Belgian Patent 588,328. Other useful thermographic additives are disclosed in the following U.S. Patents: 2,625,494, 2,637,657, 2,663,654, 2,663,655, 2,663,656, and 2,663,657.

Suitable color forming components which form colored compounds on the application of heat or when brought in contact with other color forming components on a separate support include:

(1) Organic and inorganic components; dimethyl glyoxime and nickel salts; phenolphthalein and sodium hydroxide; starch potassium iodide and oxidizing agent, i.e., peroxides; phenols and iron salts; thioacetamide and lead acetate; silver salt and reducing agent, e.g., hydroquinone.

(2) Inorganic components; ferric salts and potassium thiocyanate; ferrous salts and potassium ferricyanide; copper or silver salts and sulfide ions; lead acetate and sodium sulfide.

(3) Organic components; 2,4-dinitrophenylhydrazine and aldehydes or ketones; diazonium salt and phenol or naphthol, e.g., benzene diazonium chloride and $\beta$-naphthol; p-dimethylaminobenzaldehyde and p-diethylaminoaniline.

Photopolymerizable elements may be prepared by applying layers of the compositions of this invention on any suitable support. For example, the cellulosic supports, e.g., cellulose acetate, cellulose triacetate, cellulose mixed esters, etc., may be used. Polymerized vinyl compounds, e.g., copolymerized vinyl acetate and vinyl chloride, polystyrene, and polymerized acrylates may also be mentioned. The film formed from the polyesterification product of a dicarboxylic acid and a dihydric alcohol made according to the teachings of Alles, U.S. 2,779,684 and the patents referred to in the specification of that patent are particularly useful. Other suitable supports are the polyethylene terephthalate/isophthalates of British Patent 766,290 and Canadian Patent 562,672 and those obtainable by condensing terephthalic acid and dimethyl terephthalate with propylene glycol, diethylene glycol, tetramethylene glycol or cyclohexane 1,4-dimethanol (hexahydro-p-xylene alcohol). The films of Bauer et al., U.S. Patent 3,052,543 may also be used. The above polyester films are particularly suitable because of their dimensional stability. In addition to the above transparent supports it is also useful to coat these photopolymerizable compositions on opaque supports, e.g., paper, especially water-proof photographic paper, thin aluminum sheets, cardboard, etc. Of course various sublayers may be present to anchor the layers to the base as is common in photographic film and plate manufacture. The support can also contain various dyes, pigments, toothing agents, e.g., $SiO_2$, etc.

As may be seen by the examples, polymerization with the initiating systems of the present invention may be effected not only by exposure to ultraviolet or blue light, but also by exposure to light sources giving predominantly or only visible radiations. Thus, ordinary daylight would be adequate for photopolymerization of many of the compositions here described. Other useful light sources are those of moderate intensity which yield a high percentage of radiation in the visible spectrum, e.g., tungsten filament sources such as projection lamps, or the source can be those which are rich in the ultraviolet such as carbon arcs, mercury vapor arcs, fluorescent lamps, argon glow lamps, electronic flash units, and photographic flood lamps.

The photopolymerizable materials incorporating the initiating systems of the invention have many applications. For example, they can be used in the fabrication of photopolymerizable compositions for the production of printing plates as disclosed in Plambeck U.S. Patents 2,760,863 and 2,791,504.

The materials of the present invention are also useful for a variety of copying, i.e., office copying, recording, decorative and manufacturing applications. Pigments, e.g., $TiO_2$, colloidal carbon, metal powders, phosphors, etc., and dyes which do not appreciably absorb light at the wave length being used for exposure or inhibit polymerization can be incorporated in the light sensitive photopolymerizable layer, and by thermal transfer development, images can be transferred to a receptor support. Multicopies of the process images can be transferred to a receptor support. Multicopies of the process images can be obtained from the transferred image. The number of copies prepared is dependent on the photopolymerizable composition thickness as well as the process conditions. The invention can be used in the preparation of multicolor reproductions. The invention can be used in the production of lithographic surfaces wherein a hydrophobic layer is transferred to a hydrophilic receptor surface or vice versa. The images on the lithographic surface can be made impervious to chemical or solvent attack by post-exposing the lithographic surface. Alternatively, the exposed areas of the photopolymerizable composition, after the underexposed areas are transferred, can be used as a lithographic-offset printing plate if they are hydrophobic and the original sheet support is hydrophilic or vice versa. Silk screens can also be made with the compositions of the invention.

The basic advantage of the invention is that it provides a dry photopolymerizable system having extended sensitivity in the visible regions of the spectrum. This permits copying of ink of various colors and color reproduction. The invention provides sufficient photographic speed that photopolymerizable materials may be exposed by projection and camera type devices. Another advantage is that colored images can result simultaneously with the polymerization reaction so that the image may be visually observed without further processing steps.

With the rapid access time, good quality image reproduction and extreme contrast, provided by the materials of the invention, uses in the graphic arts field, i.e., high contrast process photography, photopolymer, lithographic film, etc., are contemplated.

As many apparently widely different embodiments of this invention may be made without departing from the spirit and scope thereof, it is to be understood that the invention is not limited to the specific embodiments thereof except as defined in the following claims.

The embodiments of the invention in which an exclusive property or privilege is claimed are defined as follows:

1. A photopolymerizable composition comprising:

(1) at least one non-gaseous ethylenically unsaturated compound capable of forming a high polymer by free-radical initiated, chain propagating, addition polymerization, (2) at least one agent selected from the group consisting of a free redical producing hydrogen donor agent and an active methylene compound, and (3) a 2,4,5-triphenylimidazolyl dimer consisting of two lophine radicals bound together by a single covalent bond.

2. A composition according to claim 1 wherein said agent is a leuco dye.

3. A composition according to claim 1 wherein said agent is an amine.

4. A composition according to claim 1 wherein at least one donor agent is N-phenylglycine.

5. A composition according to claim 1 wherein constituent (2) is an organic mercaptan.

6. An essentially colorless photopolymerizable composition according to claim 1 in the form of a layer containing:

(4) an energy-transfer dye of the xanthene and acridine classes.

7. A photopolymerizable composition according to claim 1 in the form of a layer containing: (4) an energy-transfer dye of the xanthene and acridine classes, and (5) an oxygen scavenging agent selected from the group consisting of 1-allyl-2-thiourea, 2-allyl thiourea, dimethylsulfoxide, stannous chloride, and N-phenyl-glycine.

8. A photopolymerizable element having a support and an associated layer comprising a coherent film-forming macromolecular polymer binding agent having uniformly admixed therewith (1) at least one non-gaseous ethylenically unsaturated compound capable of forming a high polymer by free-radical initiated, chain propagating, addition polymerization, (2) at least one agent selected from the group consisting of a free radical producing hydrogen donor agent and an active methylene compound, and (3) a 2,4,5-triphenylimidazolyl dimer consisting of two lophine radicals bound together by a single covalent bond.

9. An element according to claim 8 containing (4) an energy-transfer dye of the xanthene and acridine classes.

10. An element according to claim 8 containing (4) an energy-transfer dye of the xanthene and acridine classes, and (5) an oxygen scavenging agent selected from the group consisting of 1-allyl-2-thiourea, 2-allyl thiourea, dimethylsulfoxide, stannous chloride, and N-phenylglycine.

11. An element according to claim 8 wherein said support is aluminum.

12. An element according to claim 8 wherein said support is a transparent film.

13. An element according to claim 8 having an antihalation layer beneath the photopolymerizable layer.

14. A process which comprises exposing to actinic radiation selected portions of a photopolymerizable composition as defined in claim 1 until addition polymerization occurs in the exposed areas of the layer with substantially no polymerization in the unexposed areas.

15. A photopolymerizable composition comprising (1) at least one non-gaseous ethylenically unsaturated compound capable of forming a high polymer by free-radical initiated, chain propagating, addition polymerization, (2) at least one free-radical producing agent taken from the group consisting of $CBr_4$, and $C_6H_5CBr_3$ and (3) a 2,4,5-triphenylimidazolyl dimer consisting of two lophine radicals bonded together with a single covalent bond.

References Cited

UNITED STATES PATENTS 3,361,755 1/1968 Green ____________ 260—309

GEORGE F. LESMES, Primary Examiner

M. B. WITTENBERG, Assistant Examiner

U.S. Cl. X.R.

96—86, 87, 115; 204—159.23, 159.24; 260—17, 41, 309, 884, 885